(12) United States Patent
Lee et al.

(10) Patent No.: US 9,748,932 B2
(45) Date of Patent: Aug. 29, 2017

(54) PHASE LOCKED LOOP USING RECEIVED SIGNAL

(71) Applicants: Samsung Electronics Co., Ltd., Suwon-si (KR); Korea Advanced Institute of Science and Technology, Daejeon (KR)

(72) Inventors: Jaesup Lee, Yongin-si (KR); Sang-Gug Lee, Daejeon (KR); Jae-Seung Lee, Daejeon (KR); Seok-Kyun Han, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/833,725

(22) Filed: Aug. 24, 2015

(65) Prior Publication Data

US 2016/0248429 A1    Aug. 25, 2016

(30) Foreign Application Priority Data

Feb. 24, 2015    (KR) .......................... 10-2015-0025992

(51) Int. Cl.
*H03D 3/24* (2006.01)
*H03J 7/00* (2006.01)
*H04L 27/00* (2006.01)
*H03L 7/085* (2006.01)
*H03L 7/099* (2006.01)

(52) U.S. Cl.
CPC ............... *H03J 7/00* (2013.01); *H03L 7/085* (2013.01); *H03L 7/099* (2013.01); *H04L 27/00* (2013.01); *H03L 2207/06* (2013.01)

(58) Field of Classification Search
CPC .............................. H04L 7/033; H03L 7/0891
USPC .................................. 375/376; 327/156, 157
See application file for complete search history.

(56) References Cited

U.S. PATENT DOCUMENTS

| 3,328,719 | A | * | 6/1967 | De Lisle | ................. H03L 7/107 331/17 |
| 3,348,152 | A | * | 10/1967 | Laughlin, Jr. | .......... H04B 7/084 455/139 |
| 4,330,758 | A | | 5/1982 | Swisher et al. | |
| 4,384,365 | A | * | 5/1983 | Malinowski | ......... G01R 23/005 331/18 |

(Continued)

FOREIGN PATENT DOCUMENTS

| JP | 2008-205601 A | 9/2008 |
| JP | 2009-194611 A | 8/2009 |

(Continued)

OTHER PUBLICATIONS

X. Gao et al., "A Low Noise Sub-Sampling PLL in Which Divider Noise is Eliminated and PD/CP is Not Multiplied by $N^2$," *IEEE Journal of Solid-State Circuits*, vol. 44, No. 12, Dec. 2009, pp. 3253-3263.

*Primary Examiner* — Helene Tayong
(74) *Attorney, Agent, or Firm* — NSIP Law

(57) ABSTRACT

A phase locked loop includes a signal receiver configured to generate a mixed signal based on the received signal and an oscillator signal, and a frequency control circuit configured to compare the mixed signal to a reference signal, and adjust the oscillator signal based on a result of the comparing.

12 Claims, 4 Drawing Sheets

(56) References Cited

U.S. PATENT DOCUMENTS

| | | | |
|---|---|---|---|
| 6,744,828 B1* | 6/2004 | Uchiyama | H04L 27/2657 375/326 |
| 8,306,491 B2* | 11/2012 | Der | H03B 5/32 331/34 |
| 2003/0022646 A1* | 1/2003 | Bult | H01F 17/0006 455/232.1 |
| 2003/0199254 A1* | 10/2003 | Kusbel | H03J 1/0008 455/77 |
| 2009/0268859 A1 | 10/2009 | Sun et al. | |
| 2010/0310031 A1 | 12/2010 | Ballantyne et al. | |
| 2011/0188608 A1* | 8/2011 | Oba | H03D 1/00 375/316 |
| 2012/0058740 A1* | 3/2012 | Nakata | H04B 1/26 455/257 |
| 2014/0179251 A1* | 6/2014 | Persico | H03G 3/3078 455/226.2 |

FOREIGN PATENT DOCUMENTS

| | | |
|---|---|---|
| JP | 2012-217157 A | 11/2012 |
| KR | 2001-0062802 A | 7/2001 |
| KR | 2001-0091693 A | 10/2001 |

\* cited by examiner

PHASE LOCKED LOOP USING RECEIVED SIGNAL

CROSS-REFERENCE TO RELATED APPLICATION(S)

This application claims the benefit under 35 USC 119(a) of Korean Patent Application No. 10-2015-0025992 filed on Feb. 24, 2015, in the Korean Intellectual Property Office, the entire disclosure of which is incorporated herein by reference for all purposes.

BACKGROUND

1. Field

This application relates to a phase locked loop.

2. Description of Related Art

A phase locked loop is used in various circuits to lock and tune a frequency. The phase locked loop includes a frequency divider to decrease a frequency of a frequency generator. Recently, low power operation has become an important consideration in various digital devices. However, since the frequency divider has a high frequency input, the frequency divider consumes a large amount of power.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a phase locked loop includes a signal receiver configured to generate a mixed signal based on a received signal and an oscillator signal; and a frequency control circuit configured to compare the mixed signal to a reference signal, and adjust the oscillator signal based on a result of the comparing.

The signal receiver may include a mixer configured to generate the mixed signal based on a difference between the received signal and the oscillator signal.

The mixed signal may be an intermediate frequency signal; and the mixer may be a down conversion mixer configured to convert the received signal to the intermediate frequency mixed signal.

The received signal may be a high frequency signal.

The mixed signal may be an intermediate frequency signal; and the signal receiver may include an amplifier configured to amplify the intermediate frequency mixed signal.

The frequency control circuit may include a phase detector configured to compare the mixed signal to a reference signal, and output a pulse signal based on a difference between the mixed signal and the reference signal; a charge pump configured to convert the pulse signal to a voltage signal; a low pass filter configured to remove a high frequency component from the voltage signal; and an oscillator configured to generate the oscillator signal based on an output signal of the low pass filter.

The phase locked loop may further include an oscillator configured to generate the oscillator signal and including a capacitor bank; and the frequency control circuit may be further configured to detect a frequency of the oscillator signal and may include a frequency controller configured to adjust the frequency of the oscillator signal by adjusting the capacitor bank of the oscillator.

The frequency control circuit may include a Schmitt trigger configured to generate a pulse signal from the mixed signal.

The signal receiver may include a first mixer configured to generate a first mixed signal based on a difference between the received signal and a first oscillator signal; and a second mixer configured to generate a second mixed signal based on a difference between the first mixed signal and a second oscillator signal.

The first mixer may be further configured to down convert the received signal to an intermediate frequency signal; and the second mixer may be further configured to down convert the first mixed signal to a baseband signal.

The frequency control circuit may include a first frequency control circuit configured to adjust the first oscillator signal by comparing the first mixed signal to a first reference signal, and adjusting the first oscillator signal based on a result of the comparing by the first frequency control circuit; and a second frequency control circuit configured to adjust the second oscillator signal by comparing the second mixed signal to a second reference signal, and adjusting the second oscillator signal based on a result of the comparing by the second frequency control circuit.

In another general aspect, a frequency control circuit may include a phase detector configured to compare a mixed signal to a reference signal, and output a pulse signal based on a difference between the mixed signal and the reference signal; a charge pump configured to convert the pulse signal to a voltage signal; a low pass filter configured to remove a high frequency component from the voltage signal; and an oscillator configured to generate an oscillator signal based on an output signal of the low pass filter; and the mixed signal is generated based on a difference between a received signal and the oscillator signal.

The received signal may be a high frequency signal; and the mixed signal may be an intermediate frequency signal.

The oscillator may include a capacitor bank configured to control a frequency of the oscillator; and the frequency control circuit may further include a frequency controller configured to detect a frequency of the oscillator signal, and adjust the frequency of the oscillator signal by adjusting the capacitor bank of the oscillator.

The frequency control circuit may further include a Schmitt trigger configured to generate a pulse signal from the mixed signal.

In another general aspect, a method of operating a phase locked loop includes generating a mixed signal based on a received signal and an oscillator signal; comparing the mixed signal to a reference signal; and adjusting the oscillator signal based on a result of the comparing.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terminology used herein is for the purpose of describing particular examples only, and is not intended to limit the disclosure. As used herein, the singular forms "a," "an," and "the" are intended to include the plural forms as well, unless the context clearly indicates otherwise. The terms "include" and "have," when used in this specification, specify the presence of stated features, numbers, operations, elements, components, or combinations thereof, but do not preclude the presence or addition of one or more other features, numbers, operations, elements, components, or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, should be interpreted as having a meaning that is consistent with their meaning in the context of the relevant art. and are not to be interpreted in an idealized or overly formal sense unless expressly so defined herein.

Figure 1:
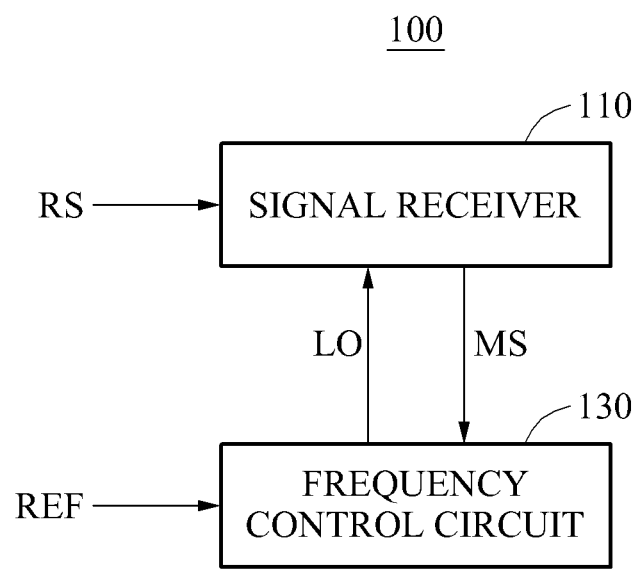
FIG. 1 is a diagram illustrating an example of a phase locked loop using a received signal.

FIG. 1 is a diagram illustrating an example of a phase locked loop using a received signal.

Referring to FIG. 1, a phase locked loop 100 includes a signal receiver 110 and a frequency control circuit 130.

The signal receiver 110 generates a mixed signal MS based on a received signal RS and an oscillator signal LO. The received signal RS may be a signal received by an external system separate from a system including the phase locked loop 100. In one example, the received signal RS has a predetermined frequency. The signal receiver 110 includes an input for receiving the received signal RS. The oscillator signal LO is a signal generated by an oscillator included in a frequency control circuit 130. The mixed signal MS is a signal in which the received signal RS and the oscillator signal LO are mixed. The signal receiver 110 will be described in detail with reference to FIG. 2.

The frequency control circuit 130 adjusts the oscillator signal LO by comparing the mixed signal MS to a reference signal REF, and adjusting the oscillator signal based on a result of the comparing. The frequency control circuit 130 locks or tunes a frequency of the oscillator signal LO. The frequency control circuit 130 does not include a frequency divider. Since the frequency divider uses a high frequency signal as an input signal, an amount of power consumption in the phase locked loop 100 increases if a frequency divider is used. The phase locked loop 100 reduces the amount of power consumption by using the received signal RS of the signal receiver 110 instead of a frequency-divided signal obtained by dividing the received signal RS with the frequency divider. The frequency control circuit 130 will be described in detail with reference to FIG. 3.

Figure 2:
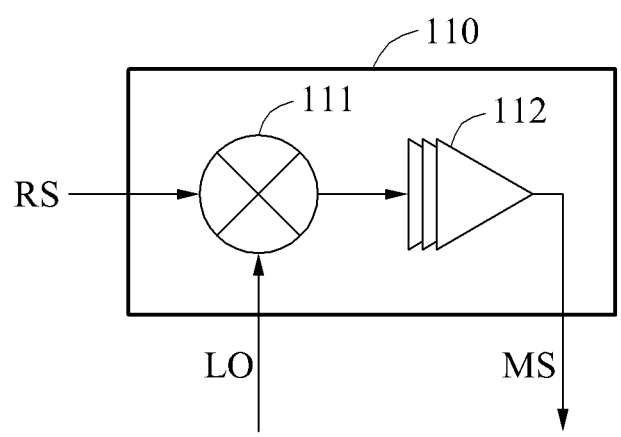
FIG. 2 is a diagram illustrating an example of a signal receiver.

FIG. 2 is a diagram illustrating an example of a signal receiver.

Referring to FIG. 2, the signal receiver 110 includes a mixer 111 and an amplifier 112.

The mixer 111 generates a mixed signal MS based on a difference between a frequency of a received signal RS and a frequency of an oscillator signal LO. The received signal RS is a high frequency signal and the mixed signal MS is an intermediate frequency signal. The mixer 111 is a down conversion mixer to convert the high frequency received signal RS to the intermediate frequency mixed signal MS. For example, the received signal RS may have a frequency of 2.398 gigahertz (GHz) and the oscillator signal LO may have a frequency of 2.4 GHz. In this example, the mixed signal MS has a frequency of 2.4 GHz−2.398 GHz=2 megahertz (MHz). Thus, in this example, the frequency of the 2.398 GHz of the received signal RS is a high frequency, and the frequency of 2 MHz of the mixed signal MS is an intermediate frequency. An intermediate frequency is a frequency that is between a high frequency and baseband. A baseband signal is a signal that has not been modulated to a higher frequency band.

The amplifier 112 amplifies the mixed signal MS. The amplifier 112 may be a single-stage amplifier or a multi-stage amplifier. The amplifier 112 is an intermediate frequency (IF) amplifier to amplify the intermediate frequency mixed signal MS. The amplifier 112 may include a variable gain amplifier (VGA) and an automatic gain control (AGC) circuit to adjust a gain of the variable gain amplifier.

Figure 3:
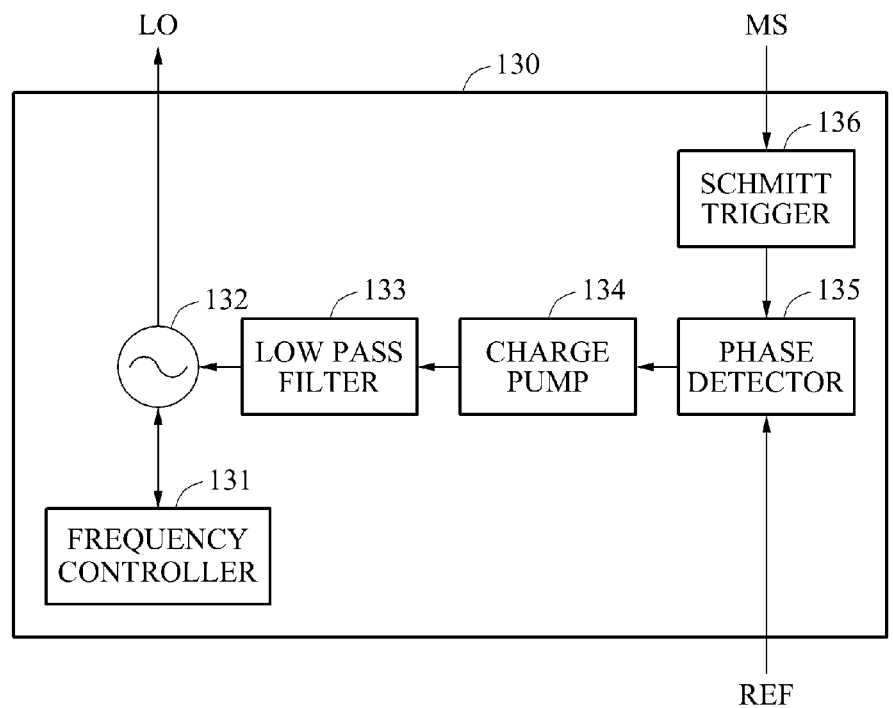
FIG. 3 is a diagram illustrating an example of a frequency control circuit.

FIG. 3 is a diagram illustrating an example of a frequency control circuit.

Referring to FIG. 3, a frequency control circuit 130 includes a frequency controller 131, an oscillator 132, a low pass filter 133, a charge pump 134, a phase detector 135, and a Schmitt trigger 136.

The frequency controller 131 detects a frequency of an oscillator signal LO. The frequency controller 131 may detect the frequency of the oscillator signal LO by counting rising edges of the oscillator signal LO during a predetermined time interval using a digital counter (not shown). For example, the frequency of the oscillator signal LO may be detected to be 2.4 GHz when a total of 2400 rising edges are counted in the oscillator signal LO during a 1 microsecond (µs) period.

The frequency controller 131 adjusts the frequency of the oscillator signal LO by adjusting a capacitor bank (not shown) of the oscillator 132. For example, the frequency controller 131 may adjust the capacitor bank to decrease the frequency of the oscillator signal LO from 2.4 GHz to 2.398 GHz.

The frequency controller 131 generates the oscillator signal LO based on an output signal of the low pass filter 133. The oscillator 132 is a local oscillator to provide the oscillator signal for a predetermined portion of a system. The oscillator 132 is a voltage controlled oscillator (VCO) to generate the oscillator signal LO based on a voltage input to the oscillator 132. The oscillator 132 generates the oscillator signal LO based on a voltage of the output signal of the low pass filter 133.

The low pass filter 133 removes a high frequency component from a voltage signal. The low pass filter 133 removes a high frequency component generated from a mixed signal MS passing through the Schmitt trigger 136, the phase detector 135, and the charge pump 134.

The charge pump 134 converts a pulse signal output from the phase detector 135 to a voltage signal. The charge pump 134 outputs a current proportional to a pulse width of the pulse signal output from the phase detector 135 to the low pass filter 133 based on a pulse code.

The phase detector 135 compares the mixed signal MS to a reference signal REF having a predetermined frequency, and outputs the pulse signal based on a difference between the mixed signal MS and the reference signal REF. The reference signal REF may be generated by a temperature compensated crystal oscillator (TCXO).

The Schmitt trigger 136 generates a pulse signal from the mixed signal MS. The Schmitt trigger 136 converts a distorted signal to a rectangular pulse. The Schmitt trigger 136 generates the pulse signal when the mixed signal MS exceeds an input threshold value.

In one example, when a frequency of the received signal RS is 2.398 GHz, the frequency of the oscillator signal LO is 2.4 GHz so that a frequency of the mixed signal MS will be 2 MHz. In one example, when a minimum increment by which a capacitance of the capacitor bank of the oscillator 132 can be adjusted is not sufficiently low and a resolution of the frequency controller 131 is not sufficiently high, the oscillator signal LO may oscillate at 2.4 GHz±Δf.

The phase detector 135 compares the mixed signal MS to the reference signal REF and generates an error pulse signal corresponding to Δf. The error pulse signal is converted to an error voltage signal as the error pulse signal passes through the charge pump 134 and the low pass filter 133. The error voltage signal is fed back to the oscillator 132 to adjust the frequency of the oscillator signal LO so Δf=0 is satisfied.

The signal receiver 110 performs the function of a frequency divider while eliminating a power consumption of a frequency divider from the phase locked loop 100.

Figure 4:
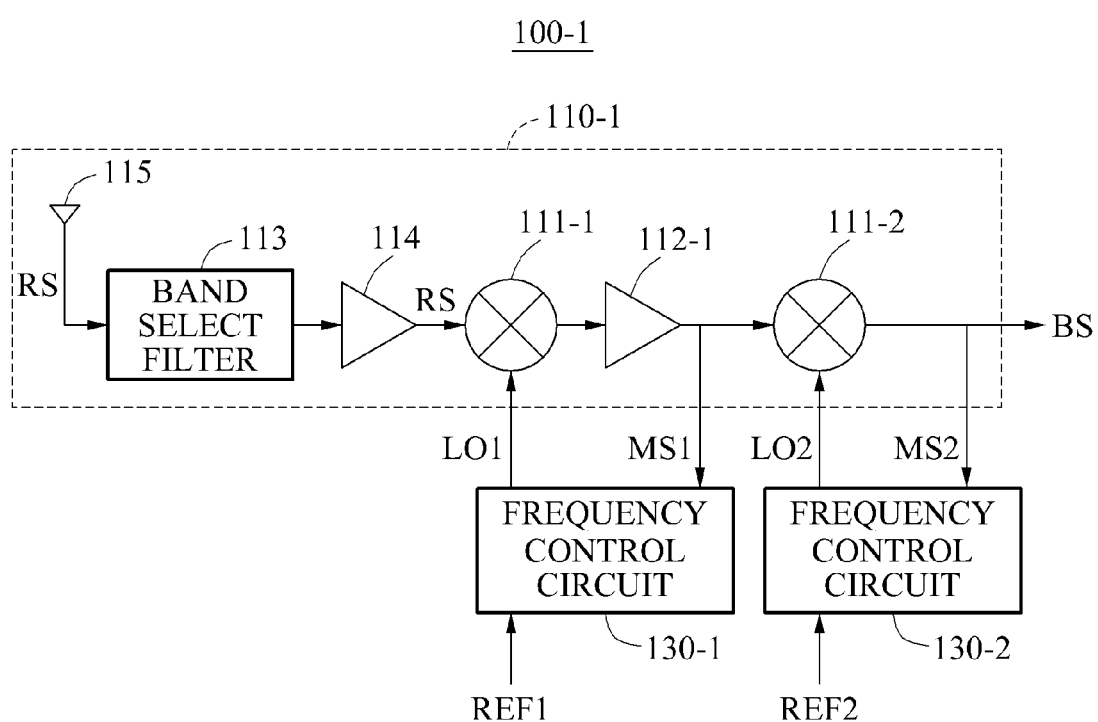
FIG. 4 is a diagram illustrating an example of a phase locked loop including a plurality of frequency control circuits.

FIG. 4 is a diagram illustrating an example of a phase locked loop including a plurality of frequency control circuits.

Referring to FIG. 4, a phase locked loop 100-1 includes a signal receiver 110-1 and frequency control circuits 130-1 and 130-2.

The signal receiver 110-1 includes an antenna 115, a band select filter 113, amplifiers 114 and 112-1, and mixers 111-1 and 111-2.

The antenna 115 receives a received signal RS from an external system separate from a system including the phase locked loop 100-1. The received signal RS is received by the antenna 115 in the example in FIG. 4. However, the received signal RS may be also received via a wired connection.

The band select filter 113 selects a predetermined band in the received signal RS. The band select filter 113 may be a band pass filter to select a predetermined band. When various channels are used in an internal system, all of the various channels may pass through the band select filter 113. When the antenna 115 is used for receiving and transmitting, a duplexer may function as the band select filter 113.

The amplifier 114 amplifies a signal of the band selected by the band select filter 113. The amplifier 114 may be a low noise amplifier (LNA).

The mixer 111-1 generates a mixed signal MS1 based on a difference between the mixed signal RS and an oscillator signal LO1. In one example, the received signal RS is a high frequency signal and the mixed signal MS1 is an intermediate frequency signal. In this example, the mixer 111-1 down converts the high frequency received signal RS to the intermediate frequency mixed signal MS1.

The amplifier 112-1 amplifies the mixed signal MS1. The amplifier 112-1 may be a single-stage amplifier or a multi-stage amplifier. The amplifier 112-1 is an intermediate frequency (IF) amplifier to amplify the intermediate frequency mixed signal MS1.

The frequency control circuit 130-1 controls the oscillator signal LO1 by comparing the mixed signal MS1 and the reference signal REF1, and adjusting the oscillator signal LO1 based on a result of the comparing. The frequency control circuit 130-1 may have the same structure and perform the same operations as the frequency control circuit 130 in FIG. 3. For example, the frequency control circuit 130-1 may include the frequency controller 131, the oscillator 132, the low pass filter 133, the charge pump 134, the phase detector 135, and the Schmitt trigger 136 in FIG. 3.

The mixer 111-2 generates a mixed signal MS2 based on a difference between the mixed signal MS1 and an oscillator signal LO2. In one example, the mixed signal MS1 is an intermediate frequency signal and the mixed signal MS2 is a baseband signal BS. In this example, the mixer 111-1 down converts the intermediate frequency mixed signal MS1 to the baseband signal BS.

The frequency control circuit 130-2 adjusts the oscillator signal LO2 by comparing the mixed signal MS2 and a reference signal REF2, and adjusting the oscillator signal LO2 based on a result of the comparing. The frequency control circuit 130-1 may have the same structure and perform the same operations as the frequency control circuit 130 in FIG. 3. For example, the frequency control circuit 130-2 may include the frequency controller 131, the oscillator 132, the low pass filter 133, the charge pump 134, the phase detector 135, and the Schmitt trigger 136 in FIG. 3.

Figure 5:
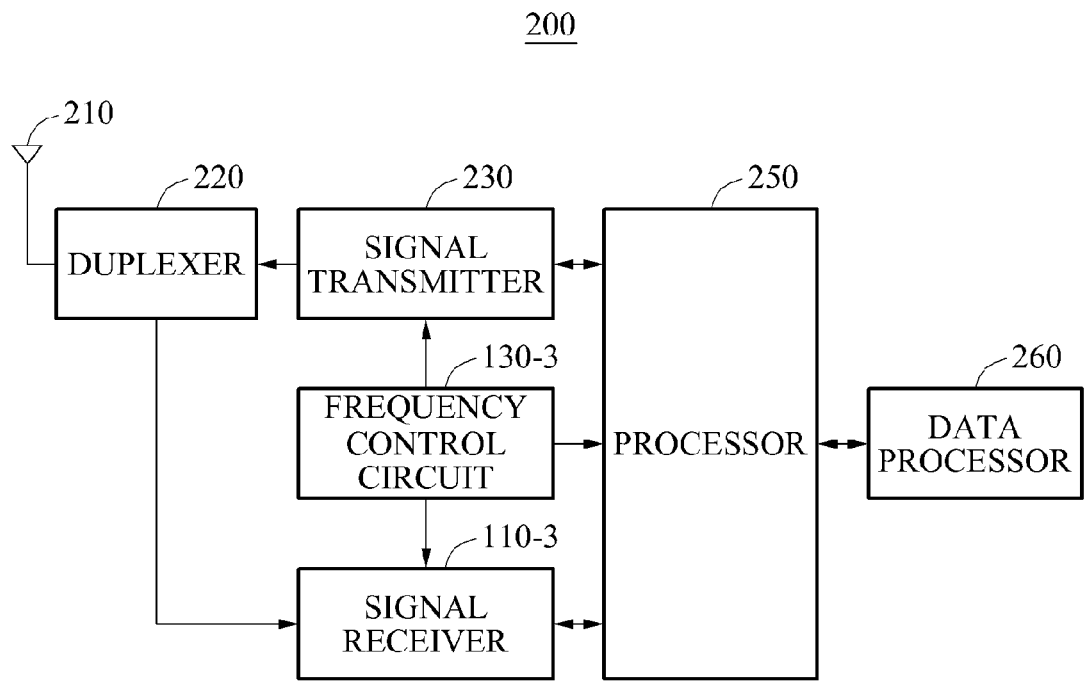
FIG. 5 is a diagram illustrating an example of a wireless communication apparatus including a frequency control circuit.

FIG. 5 is a diagram illustrating an example of a wireless communication apparatus including a frequency control circuit.

Referring to FIG. 5, a wireless communication apparatus 200 includes an antenna 210, a duplexer 220, a signal transmitter 230, a signal receiver 110-3, a frequency control circuit 130-3, and a processor 250. The wireless communication apparatus 200 may be a computer system including a security system, a set-top box, a mobile communication apparatus, an information technology (IT) apparatus, or any other wireless communication apparatus known to one of ordinary skill in the art. Although FIG. 5 illustrates some components included in the wireless communication apparatus 200 for ease of description, other hardware components may also be included in the wireless communication apparatus 200.

The duplexer 220 transmits and receives a wireless RF signal through the antenna 210.

The signal transmitter 230 receives a data signal including information, for example, a voice, an image, or data. The signal transmitter 230 converts the data signal to a wireless RF signal and transmits the wireless RF signal. The data signal may be a baseband signal.

The signal receiver 110-3 receives a wireless RF signal. The signal receiver 110-3 converts the received wireless RF signal to the data signal and outputs the data signal. The data signal may be a baseband signal.

The signal transmitter 230 or the signal receiver 110-3 operates in response to a signal output by the frequency control circuit 130-3.

The frequency control circuit 130-3 does not include a frequency divider as described above. The frequency control circuit 130-3 locks or tunes a frequency of an oscillator signal using the received wireless RF signal when the wireless communication apparatus 200 is operating in a receiving mode. The frequency control circuit 130-3 uses the received wireless RF signal by sharing at least a portion of a path of the signal receiver 110-3 for receiving the wireless RF signal.

The frequency control circuit 130-3 locks or tunes the frequency of the oscillator signal using the transmitted wireless RF signal when the wireless communication apparatus 200 is operating in a transmitting mode. The frequency control circuit 130-3 uses the transmitted wireless RF signal by sharing at least a portion of a path of the signal transmitter 230 for transmitting the wireless RF signal.

The processor 250 adjusts an operation of the signal transmitter 230 or an operation of the signal receiver 110-3. In one example, the processor may operate in response to a signal output by the frequency control circuit 130-3.

In the example in FIG. 5, the wireless communication apparatus 200 further includes a data processor 260. The data processor 260 may be a display apparatus or an input apparatus. The processor 250 controls the data processor 260.

Figure 6:
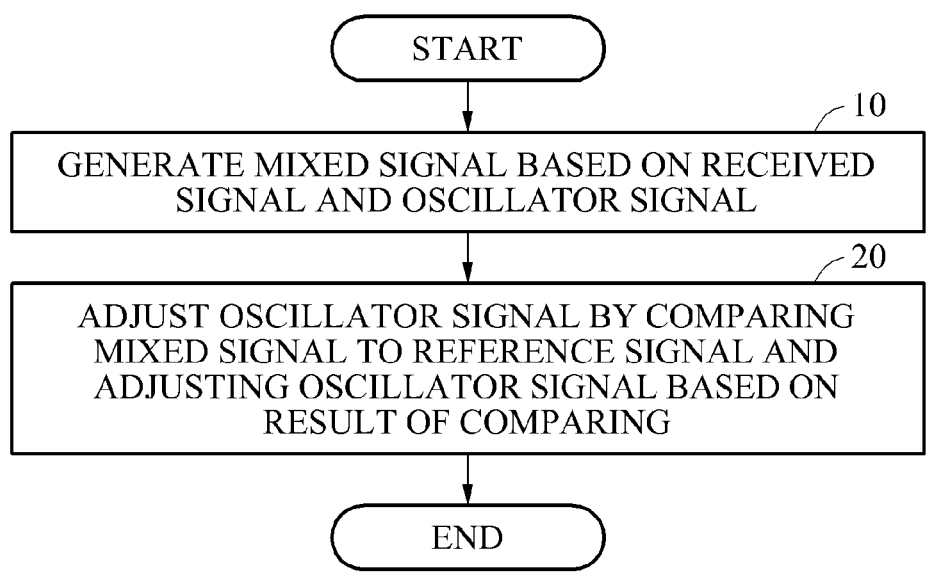
FIG. 6 is a diagram illustrating an example of a method of operating a phase locked loop using a received signal.

FIG. 6 is a diagram illustrating an example of a method of operating a phase locked loop using a received signal.

Referring to FIG. 6, in operation 10, the phase locked loop 100 generates a mixed signal based on a received signal and an oscillator signal.

In operation 20, the phase locked loop 100 adjusts the oscillator signal by comparing the mixed signal to a reference signal, and adjusting the oscillator signal based on a result of the comparing.

The signal receivers 110, 110-1, and 110-3 in FIGS. 1, 2, 4, and 5, the frequency control circuits 130, 130-1, 130-2, and 130-3 in FIGS. 1 and 3-5, the mixers 111, 111-1, and 111-2 and the amplifiers 112, 112-1, and 114 in FIGS. 2 and 4, the frequency controller 131, the oscillator 132, the low pass filter 133, the charge pump 134, the phase detector 135, and the Schmitt trigger 136 in FIG. 3, the band select filter 113 in FIG. 4, and the duplexer 220, the signal transmitter 230, the processor 250, and the data processor 260 in FIG. 5 that perform the operations described herein with respect to FIGS. 1-6 are implemented by hardware components. Examples of hardware components include controllers, generators, drivers, memories, comparators, arithmetic logic units, adders, multipliers, digital counters, frequency controllers, oscillator, low pass filters, charge pumps, phase detectors, Schmitt triggers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-6. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 6 that performs the operations described herein with respect to FIGS. 1-6 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A phase locked loop, comprising:
    a signal receiver comprising
        a first mixer configured to generate a first mixed signal based on a difference between a received signal and a first oscillator signal, and
        a second mixer configured to generate a second mixed signal based on a difference between the first mixed signal and a second oscillator signal; and
    a frequency control circuit comprising
        a first frequency control circuit configured to compare the first mixed signal to a first reference signal, and adjust the first oscillator signal based on a result of the comparing by the first frequency control circuit, and
        a second frequency control circuit configured to compare the second mixed signal to a second reference signal, and adjust the second oscillator signal based on a result of the comparing by the second frequency control circuit.

2. The phase locked loop of claim 1, wherein the first mixed signal is an intermediate frequency signal; and
    the first mixer is a down conversion mixer configured to convert the received signal to the intermediate frequency mixed signal.

3. The phase locked loop of claim 1, wherein the received signal is a high frequency signal.

4. The phase locked loop of claim 1, wherein the first mixed signal is an intermediate frequency signal; and
    the signal receiver comprises an amplifier configured to amplify the intermediate frequency mixed signal.

5. The phase locked loop of claim 1, wherein the frequency control circuit comprises:

a phase detector configured to compare the first mixed signal to the first reference signal, and output a pulse signal based on a difference between the first mixed signal and the first reference signal;
    a charge pump configured to convert the pulse signal to a voltage signal;
    a low pass filter configured to remove a high frequency component from the voltage signal; and
    an oscillator configured to generate the first oscillator signal based on an output signal of the low pass filter.

6. The phase locked loop of claim 1, further comprising an oscillator configured to generate the first oscillator signal and comprising a capacitor bank;
    wherein the frequency control circuit is further configured to detect a frequency of the first oscillator signal and comprises a frequency controller configured to adjust the frequency of the first oscillator signal by adjusting the capacitor bank of the oscillator.

7. The phase locked loop of claim 1, wherein the frequency control circuit comprises a Schmitt trigger configured to generate a pulse signal from the first mixed signal.

8. The phase locked loop of claim 1, wherein the first mixer is further configured to down convert the received signal to an intermediate frequency signal; and
    the second mixer is further configured to down convert the first mixed signal to a baseband signal.

9. An apparatus, comprising:
    a first frequency control circuit comprising
        a phase detector configured to compare a first mixed signal to a first reference signal, and output a pulse signal based on a difference between the first mixed signal and the first reference signal;
        a charge pump configured to convert the pulse signal to a voltage signal;
        a low pass filter configured to remove a high frequency component from the voltage signal; and
        an oscillator configured to generate a first oscillator signal based on an output signal of the low pass filter;
        wherein the first mixed signal is generated based on a difference between a received signal and the first oscillator signal; and
    a second frequency control circuit configured to adjust a second oscillator signal by comparing a second mixed signal to a second reference signal, and adjust the second oscillator signal based on a result of the comparing of the second mixed signal.

10. The frequency control circuit of claim 9, wherein the received signal is a high frequency signal; and
    the first mixed signal is an intermediate frequency signal.

11. The frequency control circuit of claim 9, wherein the oscillator comprises a capacitor bank configured to control a frequency of the oscillator; and
    the frequency control circuit further comprises a frequency controller configured to detect a frequency of the first oscillator signal, and adjust the frequency of the first oscillator signal by adjusting the capacitor bank of the oscillator.

12. The frequency control circuit of claim 9, further comprising a Schmitt trigger configured to generate a pulse signal from the first mixed signal.

* * * * *